United States Patent [19]

Moran

[11] Patent Number: 4,543,523
[45] Date of Patent: Sep. 24, 1985

[54] TEST TERMINAL FOR USE IN AN ELECTRIC POWER TRANSMISSION SYSTEM

[75] Inventor: John H. Moran, Stafford, N.Y.

[73] Assignee: Interpace Corporation, Parsippany, N.J.

[21] Appl. No.: 487,882

[22] Filed: Apr. 22, 1983

[51] Int. Cl.$^4$ ............................................. G01R 31/02
[52] U.S. Cl. ..................................................... 324/51
[58] Field of Search ............... 324/54, 51; 174/126 C, 174/140 C, 145; 361/39, 4

[56] References Cited
U.S. PATENT DOCUMENTS

| | | | |
|---|---|---|---|
| 2,802,176 | 8/1957 | Anderson et al. | 324/54 |
| 3,363,172 | 1/1968 | Doble | 324/54 |
| 4,237,415 | 12/1980 | Easley | 324/54 |

Primary Examiner—Stanley T. Krawczewicz
Assistant Examiner—Jack B. Harvey
Attorney, Agent, or Firm—Charles E. Baxley

[57] ABSTRACT

A test terminal for a lightning arrestor in an electric power transmission system is formed of a unitary generally cylindrical ceramic element having metallic end caps secured thereto. A bar-shaped electrical bypass conductor is removably secured to the end caps. An electrically conductive glaze is applied to the external surface of the ceramic element along a band between the end caps, and spaced apart therefrom. The electrically conductive glaze serves as a guard electrode for attachment thereto of a clamp of a test lead. The cross-sectional area of the conductor is less than approximately 5% of the mean cross-sectional area of the ceramic element.

4 Claims, 3 Drawing Figures

TEST TERMINAL FOR USE IN AN ELECTRIC POWER TRANSMISSION SYSTEM

BACKGROUND OF THE INVENTION

This invention relates to the transmission of electric power and, more particularly, to a test terminal for use in the electrical testing of a lightning arrestor without the disconnection of the transmission line conductor therefrom.

Electric power is transmitted at a variety of voltages. With respect to the transmission of power by systems operating at very high voltages, such as 345 kV (kilovolts), the physical sizes of the components of the system are massive compared to the size of the men and machinery which are employed in the installation and checkout of the equipment. Certain tests which are to be performed require the isolation of the component under test from the balance of the transmission system. However, the massive size of the components virtually precludes disconnection and reconnection of the components. For example, with reference to an electrical bushing located on the case of a transformer, circuit-breaker or other such transmission component, the electrical testing is performed by the application of a test voltage between a central conductor of the bushing and a point external to the insulation thereof. The connection of the test circuitry requires that the high-voltage electrical conductor be insulated from the test circuitry in order to insure that the test current flows through the bushing under test, and that any stray currents as may be induced by conductive pick-up from the high magnetic fields of the electric components be accounted for.

The testing situation is greatly facilitated by the use of a test terminal as is disclosed in the U.S. Pat. No. 3,363,172 issued in the name of F. C. Doble, such a test terminal often being referred to as the Doble terminal. The Doble terminal is inserted in series with the bushing, the Doble terminal being connected between the top point of the bushing and the high-voltage electrical conductor. In order to avoid the difficult and time-consuming task of disconnection of an electrical conductor for the testing of the bushing, the Doble terminal is constructed as an insulator equipped with a detachable plate-shaped conductor which bypasses the insulator to serve as a current path during normal operation of the transmission system. During testing, the bypass conductor is detached to break the connection between the bushing and the high-voltage electrical conductor. The insulator is provided with a central electrode, referred to as a guard electrode, which is utilized for the conduction of stray currents in a measurement circuit, disclosed in the foregoing Doble patent, so as to account for induced currents which would otherwise alter the measured value of the current through the bushing under tests.

A feature of the Doble terminal is found in the plate-shaped conductor which bypasses the electric current past the insulator. Since current on the order of a few thousand amperes may pass through the bypass conductor, the conductor, as well as the fittings at the ends of the Doble terminal, must be sufficiently large in cross section to accommodate the large current on a continuous basis of current flow without excessive heating. It is also desirable that the bypass conductor and the fittings be made of copper so as to reduce the resistance to the flow of electric current. As a result, the Doble terminal becomes quite heavy, and must be ruggedly constructed to withstand its own weight, as well as to provide a reliable path to the flow of the current.

While the Doble terminal can be used for bushings on the cases of transformers, circuit-breakers, and other components which are mounted within a case and have their conductors fed through apertures in the case via the bushings, the Doble terminal is less than ideal for use with a lightning arrestor which is customarily mounted in parallel electric connection with the foregoing series connection of the bushing and the Doble terminal.

The foregoing problem arises in that the Doble terminal is both massive and expensive. The expense results, in part, from the usual manufacturing process wherein the ceramic insulator is manufactured in two sections which extend outwardly from the guard electrode. Thus, there is significant cost associated with jigging of the terminal components to permit the introduction of the cement which secures the metallic fittings and the ceramic elements together. In addition, there is significant cost associated with the substantial amount of metal such as the copper, utilized in the construction of the current path.

In the case of the lightning arrestor, there is generally no flow of current except in the case of solid-state arrestors constructed of metal-oxide layers wherein there is a steady current of less than a milliampere. The major current, associated with a surge of lightning, occurs only for an instant after which the current drops back to the foregoing sub-milliampere value. It suffices, therefore, in the construction of a test terminal to modify the foregoing construction of the Doble test terminal to use substantially less metal, to use a lightweight metal, and to otherwise modify the construction of the test terminal so as to avoid the large cost and large weight of the above-described Doble terminal.

SUMMARY OF THE INVENTION

The foregoing problem is overcome and other advantages are provided by a test terminal incorporating the invention to greatly reduce the manufacturing costs, the overall weight, and to otherwise simplify the handling of a test terminal for use in a situation where the major current flow is only for an instant and only at infrequent intervals. In particular, it is thus a major object of the invention to provide a test terminal which is adapted for use with a lightning arrestor in a high voltage system for the transmission of electric power.

The invention attains the foregoing objective by the construction of a test terminal of a unitary ceramic element having a generally cylindrical shape, the departure from a true cylindrical shape being found in the undulations associated with the watershed which sheds the rain water. The guard terminal is accomplished by utilization of an electrically conductive glaze on the ceramic, this being in addition to the insulating glaze which is normally applied as a coating to the ceramic element. The electrically conducting glaze is deposited circumferentially in a band about the sides of the ceramic element within a region set back from the ends of the element. The band of the electrically conductive glaze is sufficiently wide so as to accommodate a clamp whereby the test lead for the guard electrode, referred to in the aforementioned test circuit, can be applied.

Top and bottom end fittings or caps of aluminum are adhesively secured, usually by means of portland cement, to the ceramic element, the fittings including screws for the attachment of a bypass conductor. The bypass conductor is shaped in the form of a bar and is also fabricated of aluminum. While the conductivity of aluminum is not as high as that of copper, there is adequate conductivity for the short-duration surge current associated with a lightning stroke. Also, the aluminum greatly reduces the weight of the test terminal. The end fittings, along the axis of the terminal, are provided with axially extending blades of aluminum which are readily attached to a terminal of the arrestor and the high-voltage electrical conductor. In particular, it is noted that the amount of metal can be so reduced that the cross-sectional area of the bypass conductor is less than approximately five percent of the cross-sectional area of the ceramic element.

Thereby, the test terminal has been constructed with a reduced amount of metal, with a reduced amount of ceramic components, and with a reduced amount of fittings in that the guard electrode is implemented by means of a glazing operation.

BRIEF DESCRIPTION OF THE DRAWING

The foregoing aspects and other features of the invention are explained in the following description, taken in connection with the accompanying drawing wherein.

DETAILED DESCRIPTION OF THE DRAWING

Figure 3:
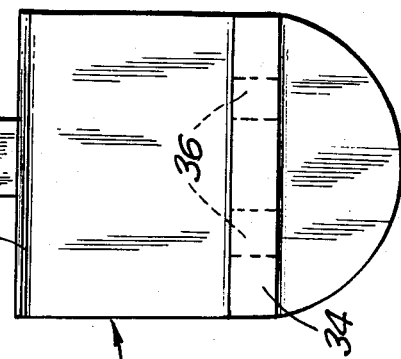
FIG. 3 is an end view of the terminal of FIG. 1.
Figure 1:
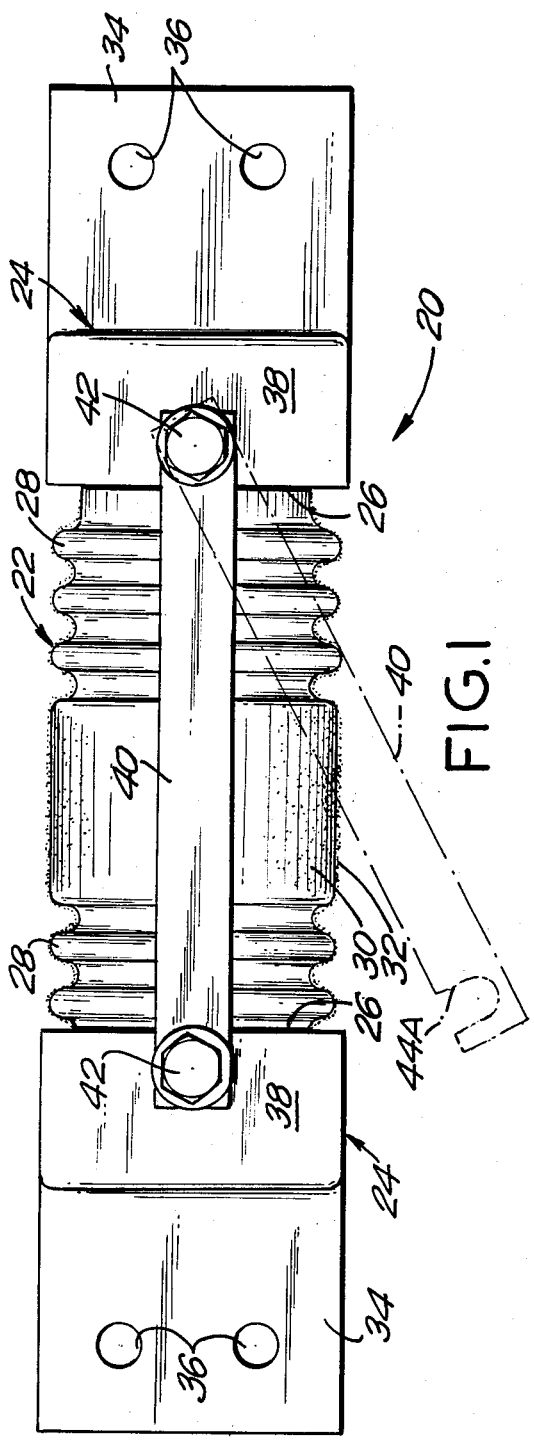
FIG. 1 is a side elevation view of a test terminal constructed in accordance with the invention.
Figure 2:
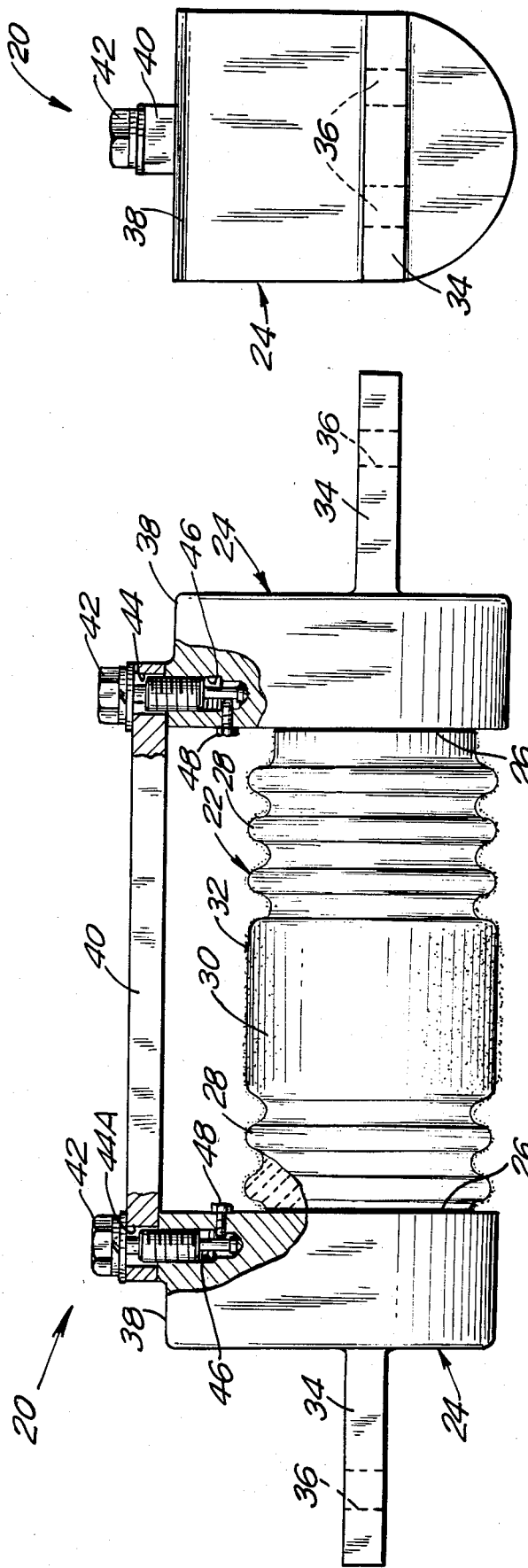
FIG. 2 is a top elevation view of the terminal of FIG. 1.

With reference to FIGS. 1, 2 and 3, a test terminal 20 in constructed in accordance with the invention. The test terminal 20 comprises a single unitary ceramic element 22 having metallic end fittings or caps 24 secured by cementing means at 26 to the ends of the element 22. The element 22 has a generally cylindrical form wherein portions of the outer surface are provided with undulations 28, and wherein a region 30 between the end fittings 24 is provided with a cylindrical shape and is coated with an electrically conducting glaze 32. The remaining portion of the external surface of the element is also glazed with the customary electrically-insulating glaze material. The end fittings 24 are preferably made of aluminum so as to attain light weight while insuring adequate electrical conductivity.

Each end fitting 24 is provided with a blade 34 which extends outwardly along the axis of the element 22 to provide electrical connection with other elements of an electric-power transmission system (not shown). For example, one blade 34 may make connection with a terminal of a lightning arrestor while the other blade may make connection with a high-voltage electrical conductor of the transmission system. The blades 34 are provided with apertures 36 by which the blades 34 may be bolted to the foregoing components of the transmission system.

The sides of each end fitting 24 are of circular cylindrical form except for one region which extends away from the axis of the element 22 to form a base 38 for the mounting of a bypass conductor 40 which is also constructed of aluminum and has the form of a bar with rectangular cross-section. The conductor 40 is secured by cap bolts 42 which pass through a round aperture 44 and a slotted aperture 44A (phantom view of FIG. 1) in the ends of the conductor 40 to threadedly mate with bores 46 in the base 38. A set screw 48 is advantageously applied at a sidewall of each bore 46 to tighten a stem of the bolt 42 so as to prevent its becoming loosened in service.

Exemplary dimensions utilized in the construction of the terminal 20 are as follows. The length of the ceramic element 22 between the end fittings 24 is 7.25 inches, the axial length of the end fitting 24 is 2 inches, the width of the base 38 is 4 inches, and the cross-sectional dimensions of the conductor 40 are 1 inch by $\frac{1}{2}$ inch.

In accordance with a feature of the invention, the foregoing construction of the test terminal 20 provides for great simplicity in the manufacturing process in that only two cementing operations need be performed, namely, one cementing operation at each of the interfaces 26 between the ends of the ceramic elements 22 and the fittings 24. Such an operation is accomplished with a relatively simple jigging procedure. Also, the application of the conductive glaze 32 is an easily performed manufacturing step since glazes are nearly always applied to ceramic materials. In this case, two glazes are applied, namely, the usual electrically-insulating glaze along the undulations 28 plus the electrically-conducting glaze 32 along the cylindrical region 30. The cylindrical region 30 is adequately wide to accommodate a clamp at the end of a test lead of test circuitry referred to hereinabove. The material of the conductive glaze 32 is well known and readily available commercially. The cross-sectional dimensions of the bar-shaped conductor 40 are adequately large to provide a suitable path for the conduction of the surge current associated with a lightning stroke. While some heating of the conductor may occur during such a surge current, there is adequate conductivity to insure that the conductor 40 will not melt, or be otherwise damaged in the presence of the lightning bolt. The configuration of the slotted aperture 44A permits the conductor 40 to be swung out in pivoting fashion about the opposite end of the conductor 40 during the implementation of the test process, the swing out configuration being shown by the phantom view of FIG. 1. With respect to the conductor 40, it is also noted that the amount of metal required therein is so small that the cross-sectional area thereof is less than approximately five percent of the mean cross-sectional area of the ceramic element 22.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

I claim:

1. A test terminal for use in an electric power transmission system, said terminal comprising:
    a unitary ceramic element including a central portion having a generally cylindrical external surface and end portions extending axially from said central portion and having undulating external surfaces;
    an exposed electrically conductive glaze localized on said cylindrical surface and providing a guard electrode of sufficient width that a clamp of a test lead can be attached thereto;
    an exposed electrically insulative glaze localized on said undulating surfaces;
    a pair of end fittings of electrically conducting material secured to opposite ends of said element; and an elongated electrical conductor connected to one of said end fittings and detachably connected to the other of said end fittings.

2. A test terminal according to claim 1 further including first and second fastening means including bolts which pass through apertures in the end portions of said electrical conductor and threadedly engage said end fittings.

3. A test terminal according to claim 2 wherein one of said apertures is formed as a slot to facilitate attachment to and detachment from the bolt of one of said fastening means and said electrical conductor is pivotally mounted about the bolt of the other said fastening means.

4. A test terminal according to claim 1 wherein said electrical conductor is a bar the cross-sectional area of which is less than approximately 5% of the mean cross-sectional area of said element.

* * * * *